US012800649B2

(12) United States Patent
Xuan

(10) Patent No.: US 12,800,649 B2
(45) Date of Patent: Nov. 17, 2026

(54) AUTOMATED TEST SYSTEM PROGRAMMABLE ATTENUATOR AND METHOD FOR PARALLEL ANALOG TIMING TESTS

(71) Applicant: Texas Instruments Incorporated, Dallas, TX (US)

(72) Inventor: Xiangdong Xuan, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 182 days.

(21) Appl. No.: 18/591,416

(22) Filed: Feb. 29, 2024

(65) Prior Publication Data

US 2025/0277847 A1 Sep. 4, 2025

(51) Int. Cl.

| | |
|---|---|
| ***G01R 31/28*** | (2006.01) |
| ***H03G 3/00*** | (2006.01) |
| ***H03G 3/30*** | (2006.01) |

(52) U.S. Cl.

CPC ..... *G01R 31/2879* (2013.01); *G01R 31/2863* (2013.01); *G01R 31/2867* (2013.01); *H03G 3/001* (2013.01); *H03G 3/30* (2013.01)

(58) Field of Classification Search

CPC ............ G01R 31/2896; G01R 31/2889; G01R 31/2886; G01R 31/2879; G01R 1/07314; G01R 1/0466

See application file for complete search history.

(56) References Cited

U.S. PATENT DOCUMENTS

| | | | | |
|---|---|---|---|---|
| 6,696,892 | B1 * | 2/2004 | Behzad | H03G 3/001 330/134 |
| 7,626,474 | B2 * | 12/2009 | Mullen | H03H 7/24 333/81 R |
| 2004/0177293 | A1 * | 9/2004 | Ricca | H04M 3/30 714/724 |
| 2013/0027825 | A1 | 1/2013 | Keller et al. | |

* cited by examiner

*Primary Examiner* — Tung X Nguyen

(74) *Attorney, Agent, or Firm* — Ronald O. Neerings; Frank D. Cimino

(57) ABSTRACT

An attenuator circuit for testing electronic devices includes a first circuit having a first input, a first output, a first resistor coupled between the first input and the first output, and a second resistor coupled between the first output and a reference node, a second circuit having a second input, a second output, and a first amplifier circuit, the second input coupled to the first output, and the first amplifier circuit coupled between the second input and the second output, and a third circuit having a third input, a third output, a second amplifier circuit, and a gain control circuit, the third input coupled to the second output, the second amplifier circuit coupled between the third input and the third output, and the gain control circuit configured to adjust a gain of the second amplifier circuit.

20 Claims, 5 Drawing Sheets

AUTOMATED TEST SYSTEM PROGRAMMABLE ATTENUATOR AND METHOD FOR PARALLEL ANALOG TIMING TESTS

BACKGROUND

Manufacturing electronic devices often involves testing operating parameters of fabricated devices to determine performance for individual device acceptance according to predefined specifications and/or to assess production process and/or material variations or other characteristics of a manufacturing operation. Automatic or automated test equipment (ATE) is used in high volume electronic device manufacturing for testing electrical performance of manufactured devices and integrated components thereof, referred to as electronic devices under test or DUTs. Important electrical performance characteristics include timing, such as switching speeds of transistors. High efficiency ATE testers utilize timing measurement units, referred to as time stampers (TSs), to measure the time between events or other temporally relevant information during operation of a tested electronic device. Production cost can be reduced by good parallel test efficiency (PTE) where the ATE system concurrently tests multiple DUTs. However, many ATE testers can accommodate only a limited number of TS for concurrent testing. For example, an ATE may be able to simultaneously test with a certain number of low power general purpose analog TSs but is limited to a smaller number of high speed digital TSs. In addition, certain DUTs are designed to operate at relatively high voltages that cannot be accommodated by the low power general purpose analog TSs, and cannot be economically tested with high PTE.

SUMMARY

In one aspect, an attenuator circuit includes first, second, and third circuits, where the first circuit has a first input, a first output, a first resistor coupled between the first input and the first output, and a second resistor coupled between the first output and a reference node, the second circuit has a second input, a second output, and a first amplifier circuit, where the second input is coupled to the first output, and the first amplifier circuit is coupled between the second input and the second output. The third circuit has a third input, a third output, a second amplifier circuit, and a gain control circuit, where the third input is coupled to the second output, the second amplifier circuit is coupled between the third input and the third output, and the gain control circuit is configured to adjust a gain of the second amplifier circuit.

In another aspect, a test system includes a handler interface board (HIB), having first and second sockets, and first and second attenuator circuits, where the first socket is configured to allow installation of a first device under test (DUT), and the second socket is configured to allow installation of a second DUT. The test system includes a first time stamper (TS) connected to the first socket, and a second TS connected to the second socket. The individual first and second attenuator circuits include first, second, and third circuits, where the first circuit is connected to a respective one of the first and second sockets and has a first input, a first output, a first resistor coupled between the first input and the first output, and a second resistor coupled between the first output and a reference node. The second circuit has a second input, a second output, and a first amplifier circuit, the second input coupled to the first output, and the first amplifier circuit coupled between the second input and the second output. The third circuit is connected to a respective one of the first and second TSs and has a third input, a third output, a second amplifier circuit, and a gain control circuit, the third input is coupled to the second output, the second amplifier circuit is coupled between the third input and the third output, and the gain control circuit is configured to adjust a gain of the second amplifier circuit.

In a further aspect, a method of fabricating an electronic device includes installing first and second electronic devices into respective first and second sockets of a handler interface board (HIB), adjusting a channel attenuator gain of respective first and second attenuator circuits of the HIB, and testing an electrical parameter of the first and second electronic devices using first and second time stampers that are connected to the respective first and second attenuator circuits of the HIB.

DETAILED DESCRIPTION

Figure 1:
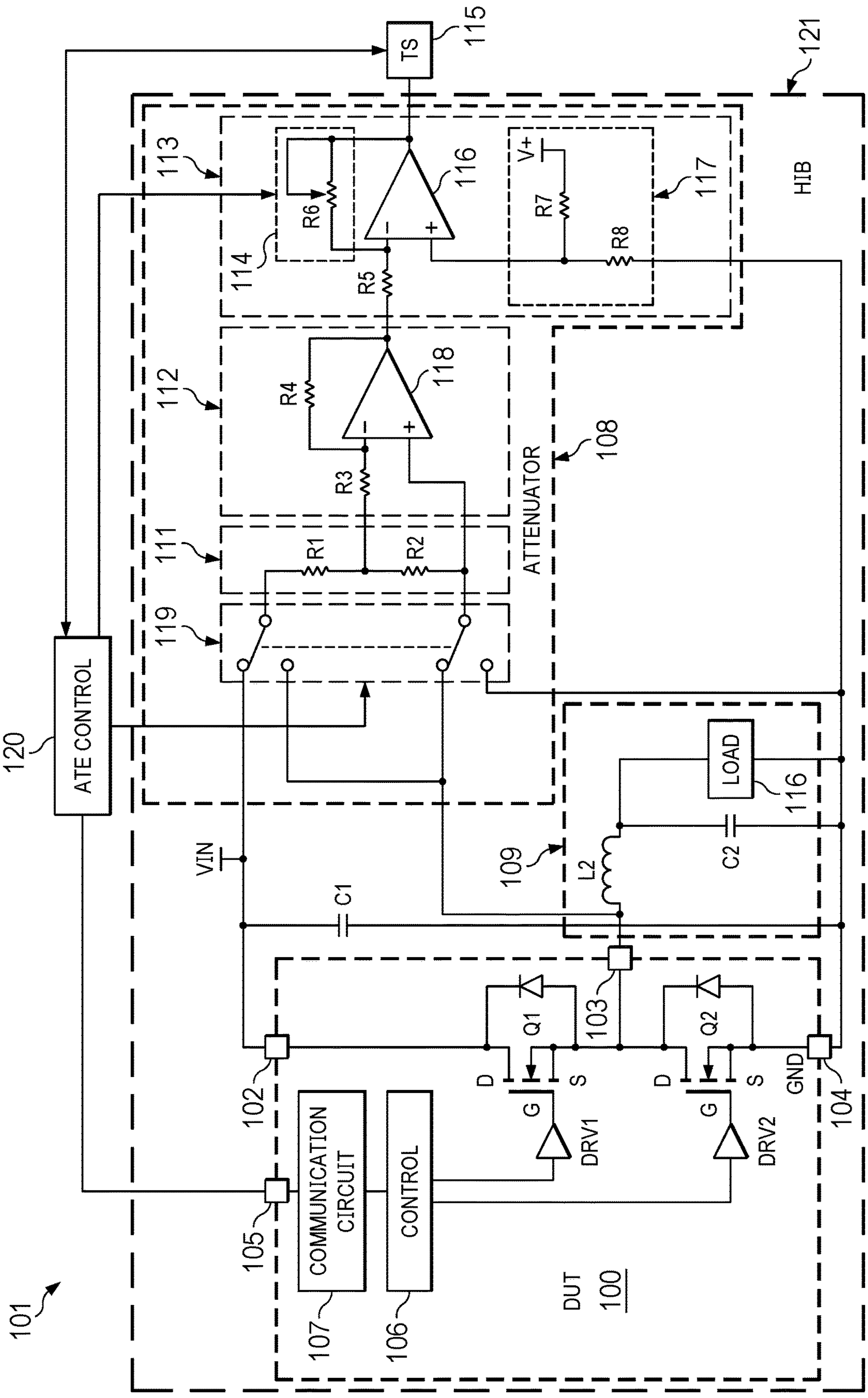
FIG. 1 is a schematic diagram of a test system with a programmable gain attenuator circuit.

In the drawings, like reference numerals refer to like elements throughout, and the various features are not necessarily drawn to scale. Also, the term “couple” or “couples” includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material. Unless otherwise stated, “about,” “approximately,” or “substantially” preceding a value means+/−10 percent of the stated value. One or more structures, features, aspects, components, etc., may be referred to herein as first, second, third, etc., for ease of description in connection with a particular drawing, where such are not to be construed as limiting with respect to the claims. Various disclosed structures and methods of the present disclosure may be beneficially applied to an electronic device, manufacturing, testing, and/or operating an electronic device such as an integrated circuit. While such examples may be expected to provide various improvements, no particular result is a requirement of the present disclosure unless explicitly recited in a particular claim.

Figure 1A:
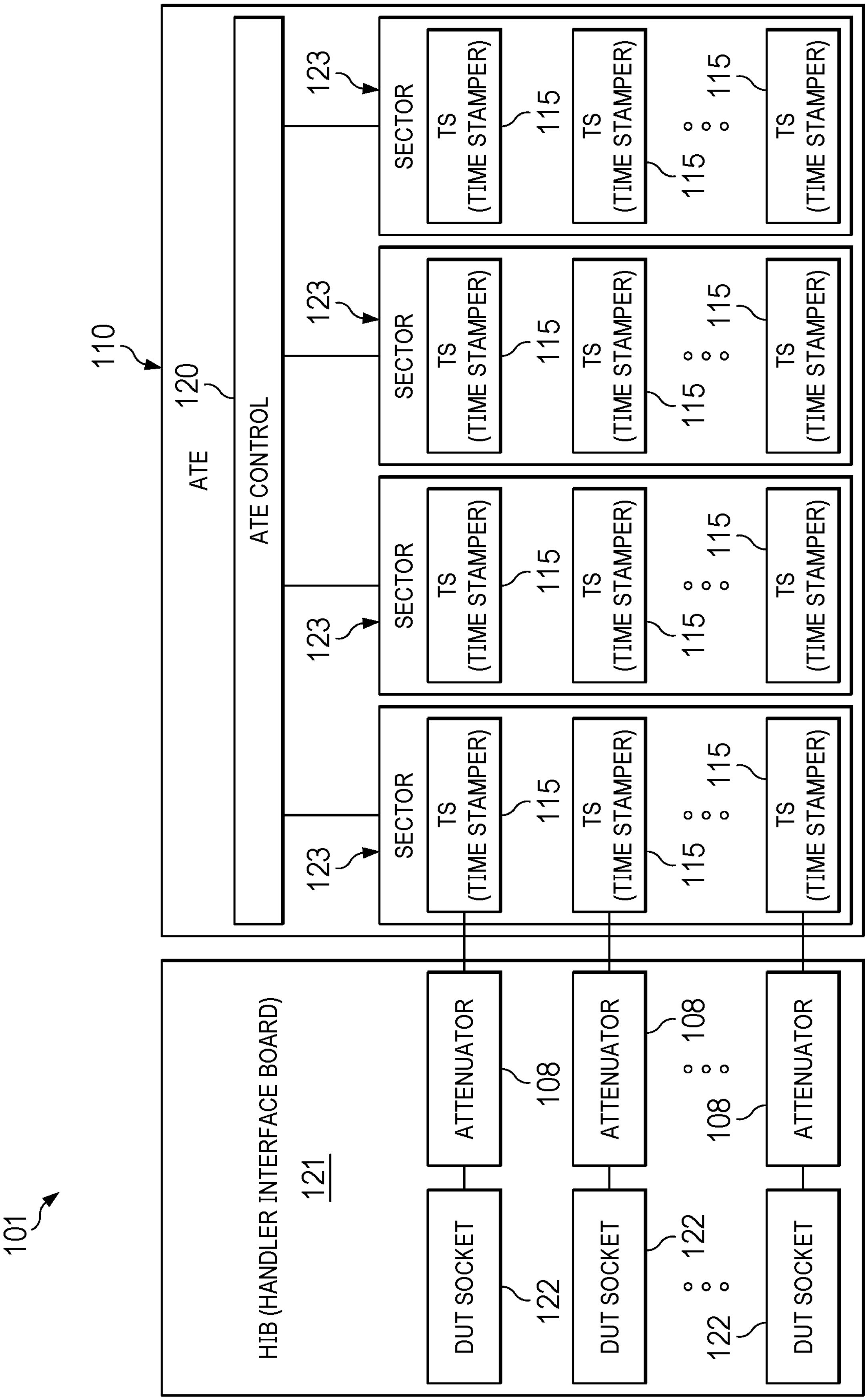
FIG. 1A is a schematic diagram of multiple channels of a parallel test implementation in the test system.

FIGS. 1 and 1A show an example of an electronic device 100, also referred to as an electronic DUT in a test system 101 with automatic test equipment (ATE) configured to perform timing tests of transistor components of manufactured electronic devices 100 installed into corresponding sockets using corresponding TSs 115. The ATE system 101 has multi-stage programmable gain attenuator circuits 108 that facilitate high-volume automated production testing of manufactured electronic devices 100 with high PTE to reduce production costs. The illustrated example uses an attenuator circuit 108 and a connected TS 115 for each concurrently tested DUT 100 in a corresponding channel, with multiple channels as shown in FIG. 1A.

The tested electronic devices 100 in the illustrated example of FIG. 1 are integrated power module devices that include a first FET transistor Q1 and a second FET transistor Q2 interconnected in a half bridge circuit as respective high and low side transistors. The transistors Q1 and Q2 each have first and second transistor terminals and a control terminal. The transistors Q1 and Q2 in this example are field effect transistors (FETs), where the first transistor terminal in this example is a drain D, the second transistor terminal is a source S, and the control terminal is a gate G. In other implementations, the transistor terminals and control terminal can be of a different form, such as emitter and collector transistor terminals and a base control terminal for bipolar transistors (not shown). The illustrated device 100 facilitates use in constructing power converters such as motor drives or DC-DC converters for use in a host circuit board or system. Other electronic device implementations can have more or fewer than two internal transistors or have different electronic component types that are tested for time-based performance during manufacturing.

The electronic device 100 has device terminals or leads, including a first device terminal 102 connected to the first transistor terminal D of the first transistor Q1, and a second device terminal 103 connected to the second transistor terminal S of the first transistor Q1. In the illustrated electronic device 100, the drain of the first transistor Q1 operates as an input voltage node labeled "VIN" with external conductivity via the first device terminal 102. In addition, the source of the first transistor Q1 is connected to the drain of the second transistor Q2 to form a switching node with external access for conductivity to an output circuit by the second device terminal 103. The electronic device 100 also has a third device terminal 104 connected to the source S of the second transistor Q2, which operates as a reference or ground connection labeled "GND" for operation of the electronic device 100 in a DC-DC converter circuit or system. The illustrated example also includes a fourth device terminal 105 as shown in FIG. 1 and may include further device terminals (not shown).

In operation of the test system 101, the electronic device 100 is installed as a DUT in a socket or other suitable interconnection structure that provides electrical connection to the device terminals 102-105 for production testing of the electronic device 100. In this example, the gate control terminal G of the first transistor Q1 is not directly connected to any device terminal. Instead, the electronic device 100 in this example has internal control and driver circuitry including a first driver circuit DRV1 and a control circuit 106 configured to operate the first control terminal or gate G of the first transistor Q1. In addition, the electronic device includes a second driver circuit DRV2 configured to operate the second control terminal or gate G of the second transistor Q1.

The illustrated example also includes a communication circuit 107 connected to the control circuit 106 and having external communications connections via the fourth device terminal 105. The communications circuit 107 in this example provides external control of the transistors Q1 and Q2 by connection of the control circuit 106 to the gate control terminals of the transistors Q1 and Q2 via the respective associated driver circuits DRV1 and DRV2. The electronic device 100 may include further logic and/or control circuitry, for example, pulse width modulation switching control logic, and may include programmed and/or programmable elements (not shown) to facilitate operation as a power module to implement one or more power conversion functions when installed in a host system (not shown). The electronic device 100 (DUT) is merely one example, and any suitable type of electronic device can be tested in the system 101 to evaluate electrical performance.

As further shown in FIG. 1A, the system 101 includes an ATE tester 110, such as a commercially available automated tester that includes a controller 120 operatively coupled with multiple TSs 115 in each of a number of different logical sectors 123. The system 101 also includes a handler interface board (HIB) 121 with multiple channels. Each channel of the HIB includes a DUT socket 122 and a programmable gain multistage attenuator circuit 108. The ATE controller 120 is operatively coupled with each of the TSs 115 in order to set or adjust associated trigger or threshold levels (e.g., signal voltage thresholds) and to receive measured timestamp information or timing data, such as transistor rise times, etc. In addition, the controller 120 is operatively coupled with the individual attenuator circuits 108 as shown in FIG. 1. In the illustrated example, the ATE controller 120 digitally programs an attenuator gain of each respective attenuator circuit 108. The controller 120 can also operate an input switching circuit 119 to selectively apply one of multiple signals to an input stage of the attenuator circuit 108. As further shown in FIG. 1, the controller 120 is operatively coupled with the electronic devices 100 in order to control operation of the tested transistors Q1 and Q2 via the communications circuit 107 and the control circuit 106 of each installed DUT electronic device 100.

As further shown in the example of FIG. 1, the test system 101 includes a test capacitor C1 connected between the device terminals 102 and 104 of each channel, as well as an output circuit 109 to provide an operational load to the half bridge circuit of the tested electronic device 100 installed in the system circuit of each channel. The output circuit 109 in one example includes an output inductor L2, a load capacitor C2, and a resistive load 116. The ATE controller 120 in one example includes a programmed or programmable processor and an electronic memory for storing data and program instructions which, when executed by the processor, implement automated transistor rise time and frequency testing and other automated test functions suitable for testing one or more electrical parameters or operating characteristics of a tested DUT electronic device 100.

In operation in one example, the ATE controller 120 actuates switching of one or both of the half bridge transistors Q1 and/or Q2 via the communication and control circuits 107 and 106 and the drivers DRV1 and DRV2 and measures a drain-source voltage of a selected one of the transistors Q1 or Q2 via the channel attenuator circuit 108 and TS 115 during switching operation. The controller 120 determines a transistor turn on rise time or turn off rise time in one example based on a time measurement from the TS 115 of the associated channel and implements similar operation in parallel for multiple installed electronic devices 100 using the associated channel attenuator circuit 108 and time stamper 115. The DUT electronic device 100 can be characterized as passing or failing a given rise time test, for example, by the controller 120 determining a pass condition of the measured rise time is less than or equal to a specified threshold value or a failure condition if the measured rise time is greater than the threshold.

The controller 120 can perform multiple tests of each installed electronic device 100 in one example. The attenuator circuit 108 in FIG. 1 is configured by socket connections to the device terminals 102, 103, and 104 to measure a voltage between the first and second device terminals 102 and 103 (e.g., a drain-source voltage of the first transistor Q1) as well as to measure a voltage between the second and third device terminals 103 and 104 (e.g., a drain-source voltage of the second device transistor Q2) by selective operation of an input switching circuit 119. In one example, the controller 120 operates the installed electronic device 100 and the TS 115 with the input switching circuit 119 in a first position to test a rise time of the first transistor Q1, and then operates the device 100 and the TS 115 with the input switching circuit 119 in a second position to test a rise time of the second transistor Q2.

In one example, the ATE 110 uses programmed digital control of an attenuator gain of the individual attenuator circuits 108 via the controller 120 in order to use a larger number of low power universal or general purpose analog TSs 115 for increased parallel test deficiency and lower manufacturing cost in producing the electronic devices 100. In one example, the system 100 can include a Teradyne EST-800 ATE tester operatively coupled with the programmable attenuator circuits 108 of the channels of the multi-channel handler interface board (HIB) 121. The HIB 121 has two or more channels and will be described with respect to first and second sockets 122 of respective first and second channels, although any number 2 or more channels can be used in various implementations.

The first socket 122 is configured to allow installation of a first DUT electronic device 100, and the second socket configured to allow installation of a second DUT electronic device 100. The first TS 115 is connected to the first socket through the first attenuator circuit 108 and a second TS 115 is connected to the second socket. The ATE 110 can implement logical sectors to provide multiple TSs 115 for connection to the attenuator circuits 108 of the respective channels, for example, to measure multiple time readings of a given waveform (e.g., transistor drain-source voltage waveform rise time and fall time as well as waveform frequency or period).

As best shown in FIG. 1, the individual attenuator circuits 108 include three stages including a first circuit 111, a second circuit 112 and a third circuit 113. The first circuit 111 is connected to the respective socket and has a first input. The first input of the first circuit 111 in the illustrated example is coupled to a first pole of the input switching circuit 119 to allow selective connection to the drain D of the first transistor Q1 or to the drain D of the second transistor Q2. In another example, the first input of the first circuit 111 is connected directly to one of the socket connections of the corresponding channel. In a further implementation, further switching circuitry can be provided (not shown) by which the first input of the first circuit 111 can be selectively connected to one of two or more socket connections. The first circuit 111 also has a first output, a first resistor R1 that is coupled between the first input 119 and the first output, and a second resistor R2 that is coupled between the first output and a reference node. In the illustrated example, the reference node is coupled to a second pole of the input switching circuit 119 that allows selective connection to the source S of the first transistor Q1 or to the source S of the second transistor Q2. The first and second resistors R1 and R2 form a resistive voltage divider configuration with a jointing node connected to the first output. The first circuit 111 provides an attenuated first output signal at the first output with an attenuated amplitude based on the values of the first and second resistors R1 and R2. In one example, the first resistor has a first resistance of approximately 100 kΩ and the second resistor R2 has a second resistance of approximately 50Ω.

The example second circuit 112 (e.g., second stage) provides a high input impedance load to mitigate current consumption of the attenuator circuit 108, along with an op amp based amplifier circuit to provide fast response to input signal changes with low time constant temporal operation. In one example, the input impedance of the second circuit 112 is greater than the sum of resistances of the first and second resistors R1 and R2 of the first circuit 111. The second circuit 112 has a second input, a second output, and a first amplifier circuit. The second input is coupled to the first output to receive the output of the resistive voltage divider formed by the resistors R1 and R2. The first amplifier circuit is coupled between the second input and the second output. Any suitable first amplifier circuit can be used in the second circuit 112. The example of FIG. 1 includes a third resistor R3, a fourth resistor R4, and a first op-amp 118. The illustrated example is configured as an inverting amplifier, although not a requirement of all possible implementations and other types and forms of first amplifier circuit can be used. The first op-amp 118 has a first (e.g., inverting) input labeled "–", and a second (e.g., non-inverting) second input labeled "+", as well as an output. The third resistor R3 is coupled between the first input "–" of the first op-amp 118 and the first output of the first circuit 111. The fourth resistor R4 is coupled in a feedback path between the first input "–" of the first op-amp 118 and the output of the first op-amp 118. The second input "+" of the first op-amp 118 is coupled to the reference node, and the output of the first op-amp 118 is coupled to the third input of the third circuit 113. In one example, the third resistor R3 has a resistance of approximately 1 kΩ and the fourth resistor R4 as a resistance of approximately 12.1 kΩ.

The third circuit 113 of the attenuator circuit 108 is connected to provide an attenuator output signal to a respective one of the TSs 115. As best shown in FIG. 1, the third circuit 113 has a third input, a third output, a second amplifier circuit, and a gain control circuit 114. The third input is coupled to the second output to receive the output signal from the second circuit 112. The second amplifier circuit is coupled between the third input and the third output. The gain control circuit 114 is configured to adjust a gain of the second amplifier circuit. Any suitable form of second amplifier circuit and gain control circuit can be used in the third circuit 113. The second amplifier circuit in the example of FIG. 1 includes a fifth resistor R5, a sixth resistor R6, and a second op-amp 116. The second op-amp 116 has inverting and non-inverting first and second inputs respectively labeled "–" and "+" and an output. The fifth resistor R5 is coupled between the output of the first op-amp 118 and the first input "–" of the second op-amp 116. The sixth resistor R6 is coupled in a feedback path between the first input "–" of the second op-amp 116 and the output of the second op-amp 116. The output of the second op-amp 116 is coupled to the third output. In one example, the fifth resistor R5 has a resistance of approximately 332Ω and the adjustable sixth resistor R6 has a total end-to-end resistance of approximately 10 kΩ, and the feedback path resistance provided by the gain control circuit 114 can be digitally programmed by the controller 120. In the illustrated example, the op amps 118 and 116 have supply terminals connected to a positive reference voltage (e.g., +5 V) and a negative reference voltage (e.g., −5 V) with respect to the circuit ground (GND) at the socket terminal 104 of the tested electronic device 100.

The gain control circuit 114 of the third circuit 113 is configured to adjust a resistance of the sixth resistor R6. The third circuit 113 in one example also includes a bias circuit 117 with a seventh resistor R7 and an eighth resistor R8. The seventh resistor R7 is coupled between a voltage reference node V+ (e.g., +5 V) and the second input "+" of the second op-amp 116, and the eighth resistor R8 is coupled between the second input "+" of the second op-amp 116 and a second reference node (e.g., labeled "GND") that is connected to the electronic device terminal 104. In the illustrated example, the attenuator circuit 108 has an adjustable signal gain of 0.03 or more and 0.20 or less, although other suitable gain adjustment ranges can be used in other implementations. In the illustrated example, moreover, the gain control circuit 114 is digitally programmable by the controller 120 in order to adjust the gain of the second amplifier circuit. This allows the controller 120 to be programmed or otherwise configured to set an attenuation gain of the attenuator circuit 108 according to one or more criterion, including without limitation a particular type of electronic device 100 being tested, a specific component type or size of the tested DUT electronic device 100 being tested, as well as test system performance adjustments, for example, to maximize a TS input signal range to improve time performance measurement accuracy and/or precision.

As illustrated in FIG. 1A, any number of parallel channels can be used with corresponding DUT sockets 122 and connected attenuator circuit instances 108 in order to interface a potentially high voltage tested DUT electronic device 100 to a corresponding TS 115 for highly parallel concurrent testing during manufacturing of the electronic devices 100. As discussed above, many commercially available ATE testers can accommodate only a limited number of TSs for concurrent testing. The adjustable gain attenuator circuits 108 facilitate improved parallel testing efficiency (PTE) by allowing a larger number of low-voltage general-purpose or universal TSs to be used for concurrently testing high voltage DUT electronic devices 100. The adjustable gain an attenuation features of the attenuator circuits 108 and the programmatic digital control thereof by the controller 120 and certain implementations allows DUT signal attenuation for time-based performance measurements by a variety of different TSs having different input voltage signal ranges. This allows selection of the TSs 115 according to parallel testing efficiency goals in a manufacturing process, thereby enhancing PTE and lowering manufacturing costs.

For example, a Teradyne ETS-800 model ATE 110 may be able to simultaneously test with up to 48 low power general purpose analog TSs per sector, but this type of TS 115 is limited to 24 V input signals. The same ATE 110 may only be able to simultaneously test with eight high-voltage digital TSs 115, which can accommodate +/−80 V input signals. To test rise time, fall time, frequency performance, or other temporal performance parameters of high voltage switching transistors, such as those used for power conversion systems, motor drives, etc., the attenuator circuit 108 allows the use of a larger number of low voltage TSs 115 for significantly improved parallel testing efficiency, while the system can accommodate testing of both low voltage and high voltage electronic devices 100 through programmatic gain adjustment by the controller 120. The attenuator circuit 108 in this example effectively reduces the input signals of up to 110 V down to 20 V range and therefore, allows the use of universal low voltage time stampers 115 (e.g., having an input range of 24 V) for timing measurements. In this example, the attenuator circuit 108 can support a site count of up to 96 in parallel on an ETS-800 a TE tester 110.

The attenuator circuit 108 in certain examples has a current consumption of 0.5 mA or less, such as approximately 237.4 μA in one simulated example with a programmable gain range of 0.045 to 0.180 with 256 programming steps allowing tailoring of the operational gain to a particular DUT testing application. In addition, the attenuator circuit 108 in these or another example has a time constant of 3 ns or less. Low current consumption in the attenuator circuit 108 allows testing of DUT electronic devices 100 having a source signal under test such as a reference signal only capable of driving a very low current. In addition, using first and second amplifier circuits in the second and third circuits 112 and 113, respectively, enhances the input impedance seen by such a signal source compared with using a simple resistive divider circuit alone. In certain implementations, moreover, the amplifier circuits can be designed with high-speed op amps 118 and 116, such as TI OPA847 op amps, which helps the attenuator circuit 108 maintain a very low time constant at the pico-second level or below. This provides significant performance test advantages with respect to timing tests of power conversion system components designed for operation at high switching speeds, where the attenuated signal provided at the third output of the attenuator circuit 108 provides accurate electronic device performance assessment where the attenuator circuit 108 has the same time-domain specs as the input signal except the voltage swing reduction. The attenuator circuits 108 allow selection of TSs 115 to maximize parallel test efficiency for the test system 101 and easy adaptation of HIBs 121 and controller programming to test a variety of existing and new device designs.

In addition, example implementations include a digitally programmable gain control circuit 114, for example, where one implementation includes a sixth resistor R6 in the form of a digital potentiometer (e.g., AD5142) so that the gain can be programed digitally by the controller 120. In such implementations, the controller 120 can adjust the output signal of the attenuator circuit 108 to the desired voltage level for the best measurement resolution on a low voltage analog time stamper 115 without any hardware changes in the system 101. The programmable attenuator gain features of the attenuator circuit 108 provides a generic solution universally applicable to various potential input signals, which is particularly attractive to ATE hardware design. Instances of the attenuator circuit 108 can, for example, be incorporated into different HIB designs to accommodate high volume manufacturing testing of a variety of different electronic device designs to facilitate system adaptation to new designs using the same a TE 110 and TSs 115 with redesigned or updated HIBs 121 and possible reprogramming of the controller 120.

Figure 2:
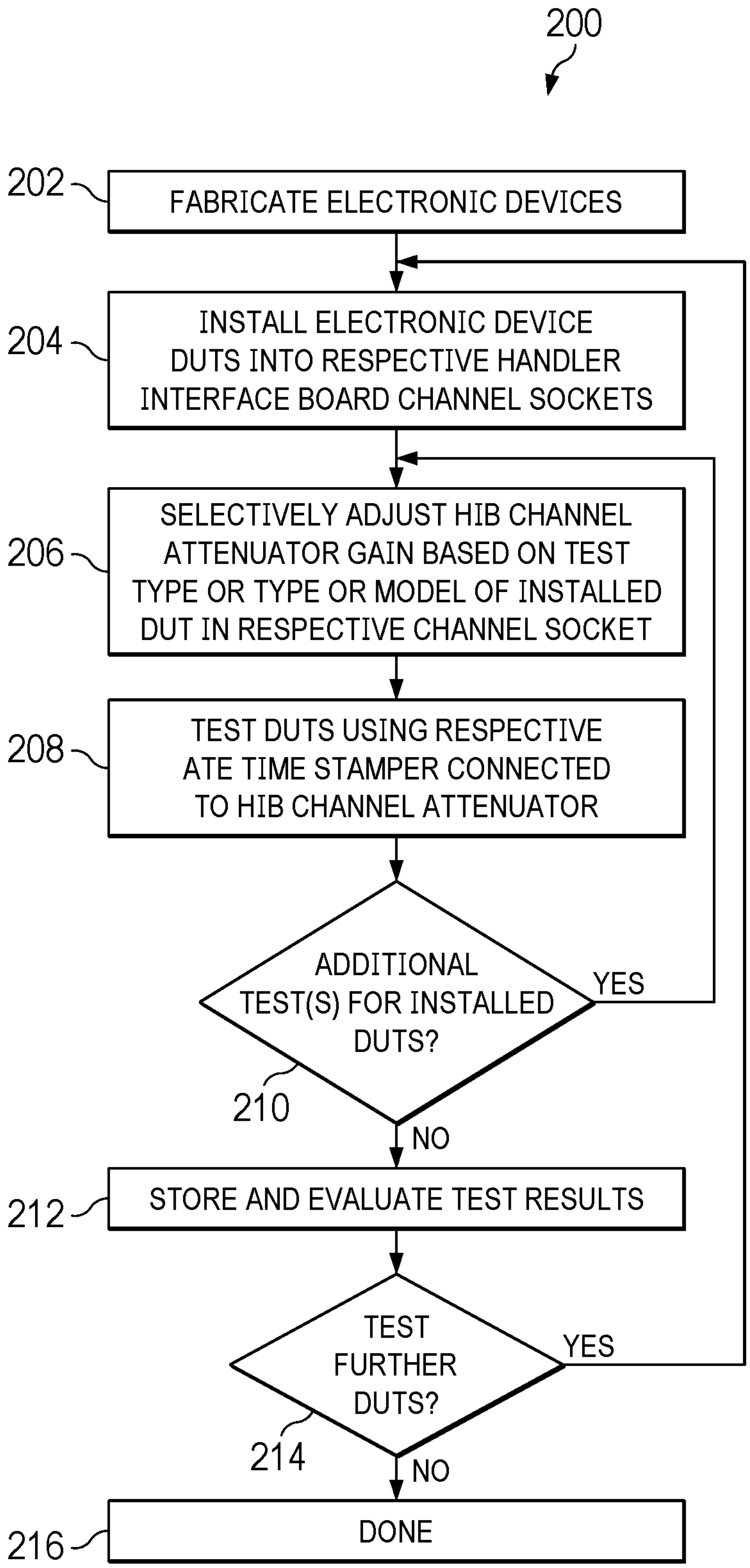
FIG. 2 is a flow diagram of a test method for fabricating an electronic device.
Figure 3:
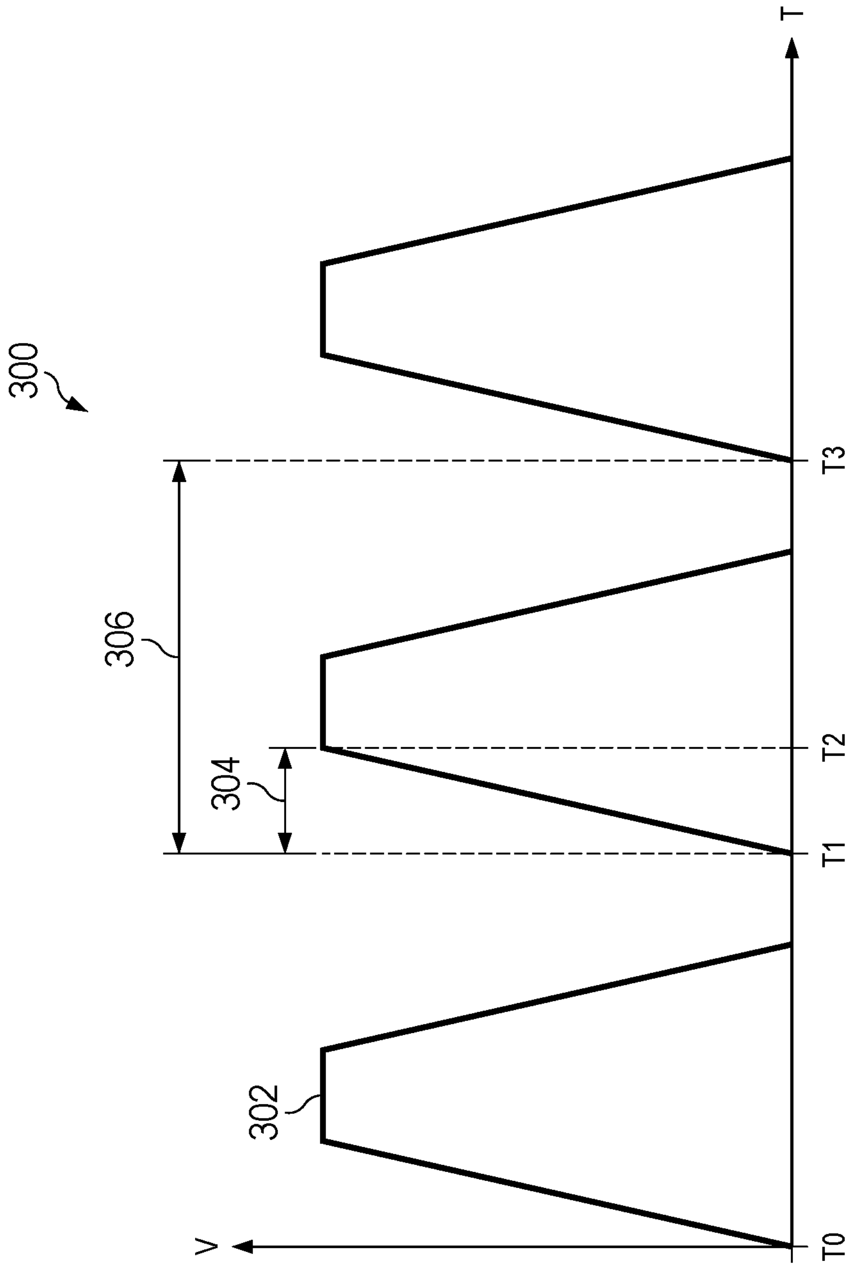
FIG. 3 is a graph of a switching signal from a tested device at an input of the attenuator circuit.
Figure 4:
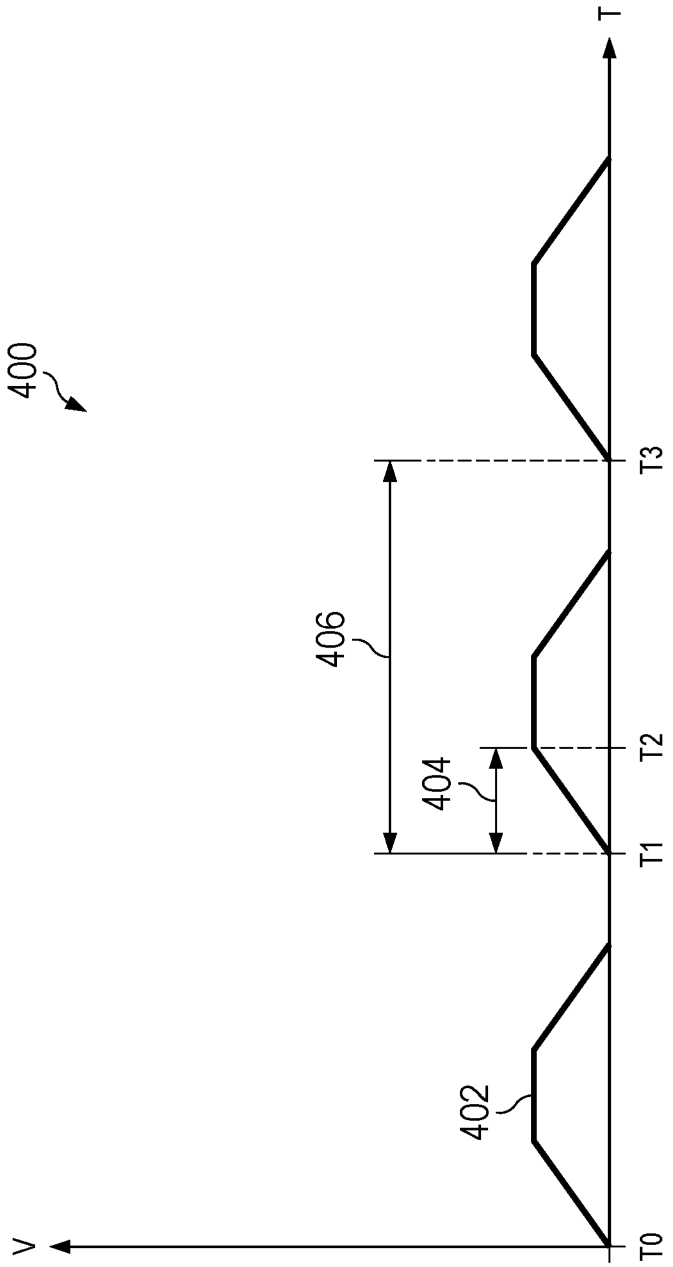
FIG. 4 is a graph of a signal from an output of the attenuator circuit.

Referring also to FIGS. 2-4, FIG. 2 shows a method 200 for fabricating an electronic device with an included electronic device test method, which can be implemented using the test system 101 described above in connection with FIGS. 1 and 1A. The method 200 begins at 202 in FIG. 2 with fabricating electronic devices, such as the example electronic device 100 described above in connection with FIG. 1. At 204, the method 200 includes installing first and second (e.g., or more) electronic devices 100 (DUTs) into respective sockets (e.g., 122) of a handler interface board HIB (e.g., 121).

At 206 in FIG. 2, the method 200 includes adjusting a channel attenuator gain of respective first and second attenuator circuits 108 of the HIB 121. In one example, the controller 120 adjusts the attenuator gain by sending a suitable digital signal to the gain control circuit 114 (e.g., digital potentiometer) to set the respective channel attenuator gain based on the type of installed DUT electronic device 100 and/or according to a particular test to be run of the installed electronic device 100. For example, multiple timing tests can be performed at different test points of a particular installed electronic device 100 (e.g., using the input switching circuit 111 of FIG. 1).

At 208 in FIG. 2, the method 200 continues with concurrently testing an electrical parameter of the electronic devices 100 using the respective time stampers 115 that are connected to the attenuator circuits 108 of the HIB 121. In one example, the controller 120 operates the installed electronic devices 100 (e.g., via the communications circuit 107 of the respective installed DUTs) and obtains timestamps or time measurements from the respective TSs 115. In one example, as illustrated and described further below in connection with FIGS. 3 and 4, the controller 120 operates the electronic devices 100 and the TSs 115 to measure a rise time of a selected transistor (e.g., Q1) of the installed electronic devices 100 at 208 in FIG. 2.

The controller 120 determines at 210 in FIG. 2 whether additional tests are desired for the installed DUT electronic devices 100. If so (e.g., YES at 210), the method 200 returns to 206 in FIG. 2. In one example, the controller 120 may switch an input switching circuit 119 to perform an additional test, and the controller 120 again adjusts the channel attenuator gain at 206 of the respective attenuator circuits 108 of the HIB 121. In one example, the controller 120 switch is the switching state of the input switching circuit 119 to perform rise time or other temporal performance measurement of the second transistors Q2 of the installed DUT electronic devices 100. At 208 in this example, the method includes testing a second electrical parameter of the electronic devices 100 using the time stampers 115 (e.g., a rise time of the prospective second transistors Q2).

Once no further tests are desired for the installed DUT electronic devices 100 (NO at 210), the controller 120 stores and evaluates the test results at 212 in FIG. 2. In one example, the controller 120 compares the measured transistor rise time values obtained from the perspective TSs 115 to an acceptance threshold at 212 and determines whether a given tested DUT passed or failed the rise time test based on whether the measured rise time is less than or exceeds the threshold specification.

At 214 in FIG. 2, the method 200 continues with the controller 120 determining whether further DUT electronic devices 100 are to be tested. If so (YES at 214) the previously tested DUT electronic devices 100 are removed from the respective HIB sockets 122, and the method 200 returns to 204 with installing further electronic devices 100 into the respective sockets 122. Once the new DUT electronic devices 100 are installed, the method 200 proceeds to 206 where the controller 120 again adjusts the channel attenuator gain of the respective attenuator circuits 108 of the HIB 121. In one example, the newly installed electronic devices 100 require a different test, and/or are of a different type that provides a different signal level to the input of the attenuator circuits 108, and the controller 120 adjust the attenuator circuit gains to accommodate the newly installed electronic devices 100. At 208, the controller 120 tests electrical parameters of the newly installed electronic devices 100 using the time stampers 115. The method 200 continues as described above for the newly installed electronic devices 100, including any desired further tests of the installed electronic devices 100 (e.g., YES at 210). Once no additional tests are desired for the currently installed devices (NO at 210) and no further DUT electronic devices 100 are to be tested (NO at 214), the method 200 is completed at 216.

FIG. 3 shows a graph 300 with a curve 302 that shows a switching signal from a tested electronic device 100 at the first input of the attenuator circuit 108 in one example. This example illustrates measurement of device transistor rise times in the test system 101 described above. In this example, the controller 120 operates the installed DUT electronic devices 100 to cause the alternate switching of the high and low side device transistors Q1 and Q2 while power is applied to the electronic devices 100. The curve 302 in FIG. 3 in this example shows the sensed drain-source voltage between the device terminals 102 and 103 during switching operation over three example switching cycles starting at an initial time T0, with a signal swing of approximately 50 V in one example. The associated time stamper 115 detects the time between a first time T1 at which the sensed drain-source voltage of the tested transistor Q1 transitions upward from 0 V to a second time T2 at which the drain-source voltage reaches a peak value (e.g., approximately 50 V), and the time stamper 115 provides a value to the controller 120 representing the rise time 304 as the difference between T1 and T2. The time stamper 115 in another example (or another TS 115 of a different sector 123 in FIG. 1A) can also measure a period 306 between times T1 and T3, for example, to determine the frequency of the switching waveform shown by curve 302 in FIG. 3.

FIG. 4 shows a graph 400 with a curve 402 that shows an attenuated signal from the third output of the attenuator circuit 108, which has a significantly attenuated amplitude (e.g., signal swing of less than 5 V). As shown in FIG. 4, the signal waveform curve 402 is slightly rounded due to frequency response characteristics of the attenuator circuit 108, but the low time constant and high input impedance of the multistage attenuator circuit 108 advantageously allows measurement of the rise time 404 (T2−T1), and the attenuated signal frequency or period 406).

Comparing the graphs 300 and 400 in FIGS. 3 and 4, the attenuator circuit 108 allows accurate time-based characterization of transistor rise time, frequency, fall time, or other time-based operating parameters of a tested DUT electronic device 100 without significant waveform distortion. The attenuator circuit 108, the test system 101, and the method 200 and alternate implementations thereof thus provide significant advantages with respect to enhanced parallel test efficiency and reduced fabrication cost while optimizing the use of maximum parallelism with programmatic adjustability for measured signal amplitudes.

In the example of FIGS. 3 and 4, the system allows verification of high speed switching circuits with measured input signal rise times of approximately 252 nano seconds and fall times of approximately 256 ns for a tested DUT electronic device 100 having an output signal swing of approximately 50 V (FIG. 3), with the resulting time stamper measurement of the attenuated signal (FIG. 4) providing a measured signal rise time above approximately 256.1 nano seconds and a fall time of approximately 260.2 nano seconds for the attenuated signal having an output swing of approximately 4.349 V.

In this example, moreover, the system can measure the attenuated signal frequency, where the DUT output signal (e.g., drain-source voltage) has a switching frequency of 1

MHz, and the system is capable of measuring the attenuated signal having a switching frequency of 996 KHz. This allows production testing to identify pass or fail status of individual DUT electronic devices 100 with high parallel test efficiency to accurately determine the quality of the manufactured electronic devices 100 in a high volume manufacturing application.

Modifications are possible in the described examples, and other implementations are possible, within the scope of the claims.

What is claimed is:

1. An attenuator circuit, comprising:

a first circuit having a first input, a first output, a first resistor coupled between the first input and the first output, and a second resistor coupled between the first output and a reference node;

a second circuit having a second input, a second output, and a first amplifier circuit, the second input coupled to the first output, and the first amplifier circuit coupled between the second input and the second output; and a third circuit having a third input, a third output, a second amplifier circuit, and a gain control circuit, the third input coupled to the second output, the second amplifier circuit directly coupling the third input to the third output, and the gain control circuit configured to adjust a gain of the second amplifier circuit.

2. The attenuator circuit of claim 1, wherein an input impedance of the second circuit is greater than a sum of resistances of the first and second resistors.

3. The attenuator circuit of claim 1, wherein the attenuator circuit has a current consumption of 0.5 mA or less.

4. The attenuator circuit of claim 1, wherein the attenuator circuit has a time constant of 3 ns or less.

5. The attenuator circuit of claim 1, wherein the attenuator circuit has an adjustable signal gain of 0.03 or more and 0.20 or less.

6. The attenuator circuit of claim 5, wherein the gain control circuit is digitally programmable to adjust the gain of the second amplifier circuit.

7. The attenuator circuit of claim 1, wherein the gain control circuit is digitally programmable to adjust the gain of the second amplifier circuit.

8. An attenuator circuit, comprising:

a first circuit having a first input, a first output, a first resistor coupled between the first input and the first output, and a second resistor coupled between the first output and a reference node;

a second circuit having a second input, a second output, and a first amplifier circuit, the second input coupled to the first output, and the first amplifier circuit coupled between the second input and the second output, wherein the first amplifier circuit includes a third resistor, a fourth resistor, and a first op-amp, the first op-amp having first and second inputs and an output, the third resistor coupled between the first input of the first op-amp and the first output, the fourth resistor coupled between the first input of the first op-amp and the output of the first op-amp, the second input of the first op-amp coupled to the reference node, and the output of the first op-amp coupled to the third input; and a third circuit having a third input, a third output, a second amplifier circuit, and a gain control circuit, the third input coupled to the second output, the second amplifier circuit coupled between the third input and the third output, and the gain control circuit configured to adjust a gain of the second amplifier circuit, wherein the second amplifier circuit includes a fifth resistor, a sixth resistor, and a second op-amp, the second op-amp having first and second inputs and an output, the fifth resistor coupled between the output of the first op-amp and the first input of the second op-amp, the sixth resistor coupled between the first input of the second op-amp and the output of the second op-amp, the output of the second op-amp coupled to the third output, and the gain control circuit configured to adjust a resistance of the sixth resistor.

9. The attenuator circuit of claim 8, comprising a bias circuit including a seventh resistor and an eighth resistor, the seventh resistor coupled between a voltage reference node and the second input of the second op-amp, and the eighth resistor coupled between the second input of the second op-amp and a second reference node.

10. An attenuator circuit, comprising:

a first circuit having a first input, a first output, a first resistor coupled between the first input and the first output, and a second resistor coupled between the first output and a reference node;

a second circuit having a second input, a second output, and a first amplifier circuit, the second input coupled to the first output, and the first amplifier circuit coupled between the second input and the second output; and a third circuit having a third input, a third output, a second amplifier circuit, and a gain control circuit, the third input coupled to the second output, the second amplifier circuit coupled between the third input and the third output, and the gain control circuit configured to adjust a gain of the second amplifier circuit, wherein:

the first circuit is connected to a first socket of a handler interface board (HIB) to interface a first time stamper (TS) of a test system to a first device under test (DUT) installed in the first socket;

the third circuit is connected to the first TS of the test system; and the HIB further comprises:

a second instance of the first circuit connected to a second socket of the HIB to interface a TS of the test system to a second DUT installed in the second socket;

a second instance of the second circuit having a second input, a second output, and a first amplifier circuit, the second input coupled to the first output, and the first amplifier circuit coupled between the second input and the second output; and a second instance of the third circuit connected to the second TS of the test system and having a third input, a third output, a second amplifier circuit, and a gain control circuit, the third input coupled to the second output, the second amplifier circuit coupled between the third input and the third output, and the gain control circuit configured to adjust a gain of the second amplifier circuit.

11. A test system, comprising:

a handler interface board (HIB), having first and second sockets, and first and second attenuator circuits, the first socket configured to allow installation of a first device under test (DUT), and the second socket configured to allow installation of a second DUT;

a first time stamper (TS) connected to the first socket; and a second TS connected to the second socket;

wherein each of the first and second attenuator circuits includes:

a first circuit connected to a respective one of the first and second sockets and having a first input, a first output, a first resistor coupled between the first input and the first output, and a second resistor coupled between the first output and a reference node;

a second circuit having a second input, a second output, and a first amplifier circuit, the second input coupled to the first output, and the first amplifier circuit coupled between the second input and the second output; and a third circuit connected to a respective one of the first and second TSs and having a third input, a third output, a second amplifier circuit, and a gain control circuit, the third input coupled to the second output, the second amplifier circuit coupled between the third input and the third output, and the gain control circuit configured to adjust a gain of the second amplifier circuit.

12. The test system of claim 11, wherein an input impedance of each respective second circuit is greater than a sum of resistances of the first and second resistors.

13. The test system of claim 11, wherein each respective attenuator circuit has a current consumption of 0.5 mA or less.

14. The test system of claim 11, wherein each respective attenuator circuit has a time constant of 3 ns or less.

15. The test system of claim 11, wherein each respective attenuator circuit has an adjustable signal gain of 0.03 or more and 0.20 or less.

16. The test system of claim 11, wherein each respective gain control circuit is digitally programmable to adjust the gain of the respective second amplifier circuit.

17. The test system of claim 11, wherein:

each respective first amplifier circuit includes a third resistor, a fourth resistor, and a first op-amp, the first op-amp having first and second inputs and an output, the third resistor coupled between the first input of the first op-amp and the first output, the fourth resistor coupled between the first input of the first op-amp and the output of the first op-amp, the second input of the first op-amp coupled to the reference node, and the output of the first op-amp coupled to the third input; and each respective second amplifier circuit includes a fifth resistor, a sixth resistor, and a second op-amp, the second op-amp having first and second inputs and an output, the fifth resistor coupled between the output of the first op-amp and the first input of the second op-amp, the sixth resistor coupled between the first input of the second op-amp and the output of the second op-amp, the output of the second op-amp coupled to the third output, and the gain control circuit configured to adjust a resistance of the sixth resistor.

18. A method of fabricating an electronic device, the method comprising:

installing first and second electronic devices into respective first and second sockets of a handler interface board (HIB);

adjusting a channel attenuator gain of respective first and second attenuator circuits of the HIB; and testing an electrical parameter of the first and second electronic devices using first and second time stampers that are connected to the respective first and second attenuator circuits of the HIB.

19. The method of claim 18, further comprising:

again adjusting the channel attenuator gain of the respective first and second attenuator circuits of the HIB; and testing a second electrical parameter of the first and second electronic devices using the first and second time stampers.

20. The method of claim 18, further comprising:

installing third and fourth electronic devices into the respective first and second sockets of the HIB;

adjusting the channel attenuator gain of the respective first and second attenuator circuits of the HIB; and testing an electrical parameter of the third and fourth electronic devices using the first and second time stampers.

* * * * *